United States Patent [19]

Arai

[11] Patent Number: 5,617,324
[45] Date of Patent: Apr. 1, 1997

[54] REMAINING BATTERY CAPACITY MEASURING METHOD AND APPARATUS

[75] Inventor: Youichi Arai, Shizuoka-ken, Japan

[73] Assignee: Yazaki Corporation, Tokyo, Japan

[21] Appl. No.: 628,334

[22] Filed: Apr. 5, 1996

[30] Foreign Application Priority Data

Apr. 7, 1995 [JP] Japan ................................ 7-082375

[51] Int. Cl.$^6$ .......................... G01R 19/00; H02J 7/04
[52] U.S. Cl. ......................... 364/483; 364/481; 324/427; 324/428; 320/48
[58] Field of Search ................................... 364/481, 483; 324/426, 427, 428, 429, 430, 431, 433; 320/31, 32, 35, 39, 43, 44, 48

[56] References Cited

U.S. PATENT DOCUMENTS

| | | | |
|---|---|---|---|
| 4,558,281 | 12/1985 | Codd et al. | 324/433 |
| 5,032,825 | 7/1991 | Kuznicki | 340/636 |
| 5,287,286 | 2/1994 | Ninomiya | 364/481 |
| 5,321,627 | 6/1994 | Reher | 364/483 |
| 5,404,106 | 4/1995 | Matsuda | 324/431 |
| 5,406,266 | 4/1995 | Mino et al. | 340/636 |
| 5,473,262 | 12/1995 | Yoshimatsu | 324/771 |
| 5,479,085 | 12/1995 | Honda et al. | 320/48 |

*Primary Examiner*—James Trammell
*Assistant Examiner*—Demetra R. Smith
*Attorney, Agent, or Firm*—Finnegan, Henderson, Farabow, Garrett & Dunner, L.L.P.

[57] ABSTRACT

A remaining battery capacity measuring apparatus comprises: a voltage-current change trend calculating section (21) for detecting dispersive terminal voltages and discharge currents of a battery; a voltage-current approximate linear function calculating section (25) for calculating an approximate linear function indicative of a trend of the detected dispersive terminal voltages and discharge currents; a correlation coefficient calculating section (28) for calculating a correlation coefficient between the detected dispersive terminal voltages and discharge currents; a correlation coefficient deciding section (29) for deciding whether the calculated correlation coefficient less than a negative reference value can be calculated continuously or not, and for enabling the voltage-current approximate linear function calculating section (25) to output the calculated approximate linear function, only when the correlation coefficient less than the negative reference value can be calculated continuously; and a remaining battery capacity calculating section (23) for calculating a remaining battery capacity on the basis of a terminal voltage corresponding to a reference discharge current along the outputted approximate linear function.

7 Claims, 6 Drawing Sheets

CURRENT DATA

CURRENT FLUCTUATIONS

VOLTAGE DATA

VOLTAGE FLUCTUATIONS

ERROR DUE TO DATA INCLUDING REGENERATIVE CHARGE

ERROR DUE TO DATA INCLUDING NON-DISCHARGE (STOP)

REMAINING BATTERY CAPACITY MEASURING METHOD AND APPARATUS

BACKGROUND OF THE INVENTION

1. Field of the Invention

The present invention relates to a remaining battery capacity measuring method and apparatus, and more specifically to the method and apparatus for displaying a remaining battery capacity precisely, in particular when there exists no strong correlation between dispersive voltages and dispersive currents of a battery to be measured.

2. Description of the Prior Art

In general, there exists a negative correlation between the dispersive voltages and the dispersive currents of a battery. In other words, when the discharge current is small, the battery voltage is high; and when the discharge current is large, the battery voltage is low, in general. Further, when the battery capacity is low, the battery voltage drops more at a constant current, as compared when the battery capacity is high.

By utilizing the above-mentioned battery discharge characteristics, a remaining battery capacity can be estimated, as disclosed in Japanese Patent Application No. (6-200953, for instance. In this prior art method, for instance, dispersive battery voltages and dispersive battery currents flowing through various loads are sampled for each predetermined time interval; the sampled voltage and current data are averaged for each predetermined time interval; when a predetermined number of average voltage and current data have been obtained respectively, an approximate linear function (equation) is calculated on the basis of the average voltage and current data and in accordance with the least square method and further a correlation coefficient is calculated on the basis of the average voltage and current data; when the calculated correlation coefficient is smaller than a negative reference value (i.e., a strong correlation is obtained), a voltage corresponding to a predetermined discharge current is calculated on the basis of the approximate linear Function; and finally a remaining battery capacity corresponding to the voltage is estimated and displayed.

In summary, on the basis of the fact there exists a negative correlation (e.g., less than −0.9) between the dispersive voltages and currents of the battery, the approximate linear function is calculated by use of the average dispersive voltage and current data of the battery, and the remaining battery capacity is estimated on the basis of the calculated approximate linear function.

In the prior art remaining battery capacity measuring method, however, a problem arises when this measuring apparatus is mounted on an electric vehicle to measure the remaining capacity of a traction battery, for instance. In more detail, since the electric vehicle is driven by a motor mounted thereon by use of the battery energy, when the electric vehicle is running on a descending road and therefore the accelerator is not depressed by the driver, the motor generates a regenerative current as a generator, so that the traction battery is reversely charged by this regenerative current of the motor. In this case, although the power reduction of the traction battery can be prevented, there exists a tendency that the voltage rises gradually due to a charge by the regenerative current of the motor.

Further, in this case, although it is possible to detect the regenerative current to disable the measuring apparatus in such an unusual state, since the regenerative current must be detected by use of a complicated detection system, the detection system becomes costly, so that another detection system is not adopted usually.

Further, when the electric vehicle is left stopped, since the traction battery is not consumed, the battery voltages and currents hardly change. Under these conditions, in spite of the fact that the correlation is not established between the voltages and currents of the traction battery, when the approximate linear function of the voltages and currents of the battery is calculated and further the correlation is determined as being less than a reference value erroneously, the remaining battery capacity is also estimated erroneously.

In other words, in the prior art remaining battery capacity measuring method as described above, once the regenerative current is being generated by the motor or when the vehicle is left stopped, the definition of the detected battery current is not clear. As a result, when the approximate linear function between the currents and voltages of the battery is calculated on the basis of this indefinite voltages and currents, a measurement error is inevitably produced, thus deteriorating the reliability of the remaining battery capacity measuring apparatus.

SUMMARY OF THE INVENTION

With these problems in mind, therefore, it is the object of the present invention to provide a remaining battery capacity measuring method and apparatus, which can measure the remaining battery capacity accurately, even when regenerative current is being generated by a motor and thereby the battery is being charged by the motor or when the battery is not being discharged.

To achieve the above-mentioned object, the present invention provides a remaining battery capacity measuring method, comprising the steps of: sampling dispersive terminal voltages and dispersive discharge currents of a battery connected to a fluctuating load; calculating an approximate linear function indicative of a trend of the sampled dispersive terminal voltages and the sampled dispersive discharge currents; calculating a correlation coefficient between the sampled dispersive terminal voltages and the sampled dispersive discharge currents; comparing the calculated correlation coefficient with a negative reference value, to discriminate whether the calculated correlation coefficient indicates a strong correlation or not; discriminating whether the strong correlation is calculated repeatedly by a predetermine number of times or not; calculating a remaining battery capacity on the basis of a sampled terminal voltage corresponding to a reference discharge current and in accordance with the calculated approximate linear function, only when the strong correlation is calculated repeatedly by the predetermined number of times; and repeating the above-mentioned steps to update the calculated remaining battery capacity for each predetermined time interval.

Further, the present invention provides a remaining battery capacity measuring method, comprising the steps of: sampling dispersive terminal voltages and dispersive discharge currents of a battery connected to a fluctuating load; calculating a correlation coefficient between the sampled dispersive terminal voltages and the sampled dispersive discharge currents; comparing the calculated correlation coefficient with a negative reference value, to discriminate whether the calculated correlation coefficient indicates a strong correlation or not; discriminating whether the strong correlation is calculated repeatedly by a predetermine number of times or not; calculating an approximate linear function indicative of a trend of the sampled dispersive terminal voltages and the sampled dispersive discharge currents, only when the strong correlation is calculated repeatedly by the predetermined number of times; calculating a remaining battery capacity on the basis of a sampled terminal voltage corresponding to a reference discharge current and in accordance with the calculated approximate linear function; and repeating the above-mentioned steps to update the calculated remaining battery capacity for each predetermined time interval.

Further, the step of sampling dispersive terminal voltages and dispersive discharge currents comprises the steps of: detecting the dispersive terminal voltages and discharge currents for each first predetermined time interval; calculating an average terminal voltage and an average discharge current on the basis of the detected dispersive terminal voltages and the detected dispersive discharge currents, respectively for each second predetermined time interval longer than the first predetermined time interval; counting the number of the calculated average terminal voltages or the average discharge currents; comparing the counted number with a predetermined value; when the counted number reaches the predetermined number, calculating the approximate linear function and the correlation coefficient, respectively on the basis of the average terminal voltages and the average discharge currents, for each third predetermined time interval longer than the second predetermined time interval.

Further, in step of calculating a remaining battery capacity on the basis of a sampled voltage corresponding to a reference discharge current and in accordance with the calculated approximate linear function, the remaining battery capacity is calculated in accordance with the approximate linear function calculated by the sampled voltages and currents used to calculate the middle correlation coefficient of a plurality of the repeatedly calculated correlation coefficients.

Further, the present invention provides a remaining battery capacity measuring apparatus, which comprises: voltage-current change trend calculating means for detecting dispersive terminal voltages and dispersive discharge currents of a battery connected to a fluctuating load; voltage-current approximate linear function calculating means for calculating an approximate linear function indicative of a trend of the detected dispersive terminal voltages and the detected dispersive discharge currents; correlation coefficient calculating means for calculating a correlation coefficient between the detected dispersive terminal voltages and the detected dispersive discharge currents; correlation coefficient deciding means for deciding whether the calculated correlation coefficient equal to or less than a negative reference value can be calculated by a predetermined number of times continuously or not, and for enabling said voltage-current approximate linear function calculating means to output the calculated approximate linear function, only when the correlation coefficient equal to or less than the negative reference value can be calculated by the predetermined number of times continuously; and remaining battery capacity calculating means for calculating a remaining battery capacity on the basis of a terminal voltage corresponding to a reference discharge current in accordance with the approximate linear function outputted by said voltage-current approximate linear function calculating means.

Further, it is preferable that when the calculated correlation coefficient equal to or less than the negative reference value cannot be calculated by the predetermined number of times continuously, said correlation coefficient deciding means disables said voltage-current approximate linear function calculating means to output the calculated approximate linear function.

Further, it is preferable that when a calculated correlation coefficient equal to or less than the negative reference value can be calculated by the predetermined number of times continuously, said correlation coefficient deciding means enables said voltage-current approximate linear function calculating means to output a middle approximate linear function calculated by the detected, terminal voltages and the detected discharge currents used to calculate a middle correlation coefficient of a plurality of the repeatedly calculated correlation coefficients.

In the remaining battery capacity measuring method and apparatus according to the present invention, the dispersive terminal voltages and dispersive discharge currents of a battery connected to a fluctuating load are sampled. Further, an approximate linear function indicative of a trend of the sampled terminal voltages and the sampled discharge currents is calculated, and a plurality (three) of the correlation coefficients between these sampled terminal voltages and the sampled discharge currents are calculated. Further, a remaining battery capacity is calculated on the basis of a sampled terminal voltage corresponding to a reference discharge current and in accordance with the calculated approximate linear function. In this case, when a strong correlation coefficient is not obtained three times continuously, since the remaining battery capacity is not calculated in accordance with the approximate linear function indicative of a trend of the voltages and currents of the battery, it is possible to prevent the remaining battery capacity from being updated erroneously, as when the battery is charged by a regenerative current of a motor (e.g., when an electric vehicle is running on a descending load) or when the battery is not discharged (e.g., when the electric vehicle is left stopped).

DETAILED DESCRIPTION OF THE PREFERRED EMBODIMENTS

Prior to the detailed description of the embodiment according to the present invention, the principle and the gist of the method and apparatus of the present invention will be explained hereinbelow with reference to the attached drawings.

Figure 5A:
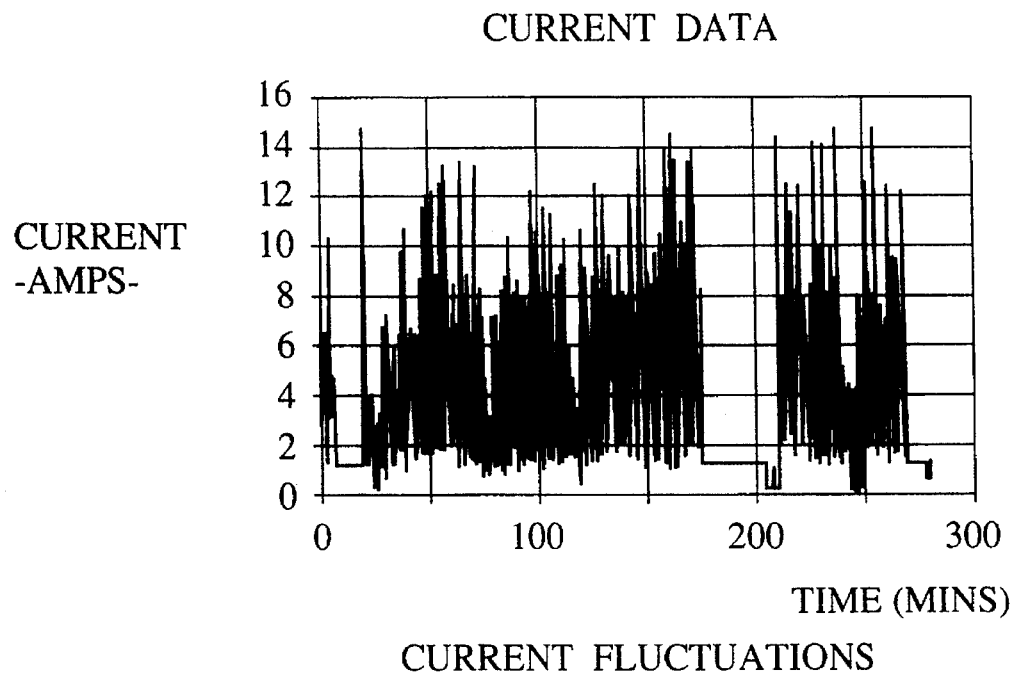
FIGS. 5A and 5B are graphical representations showing an example of current fluctuations and voltage fluctuations with the lapse of time, respectively.
Figure 5B:
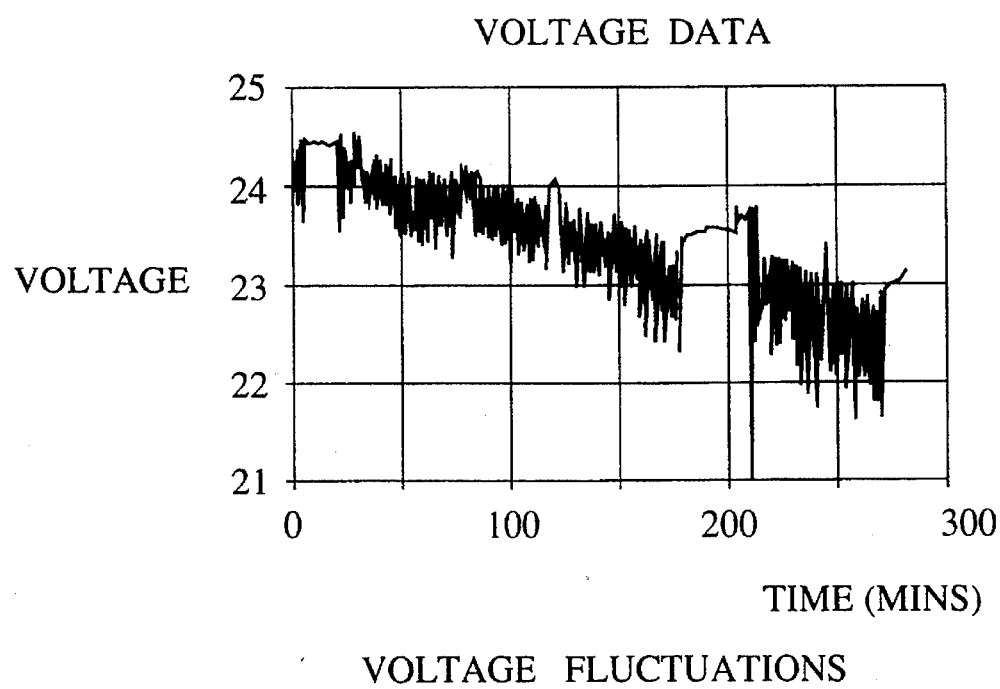

FIG. 5A shows dispersive current data of a battery which varies with the lapse of time, and FIG. 5B shows dispersive voltage data of the same battery which also varies with the same lapse of time. FIGS. 5A and 5B indicate that when battery current is large, the battery voltage is low; and when battery current is small, the battery voltage is high. In addition, it can be understood that even if the battery current is the same, the battery voltage decreases with lapse of time due to power consumption of the battery.

Figure 6A:
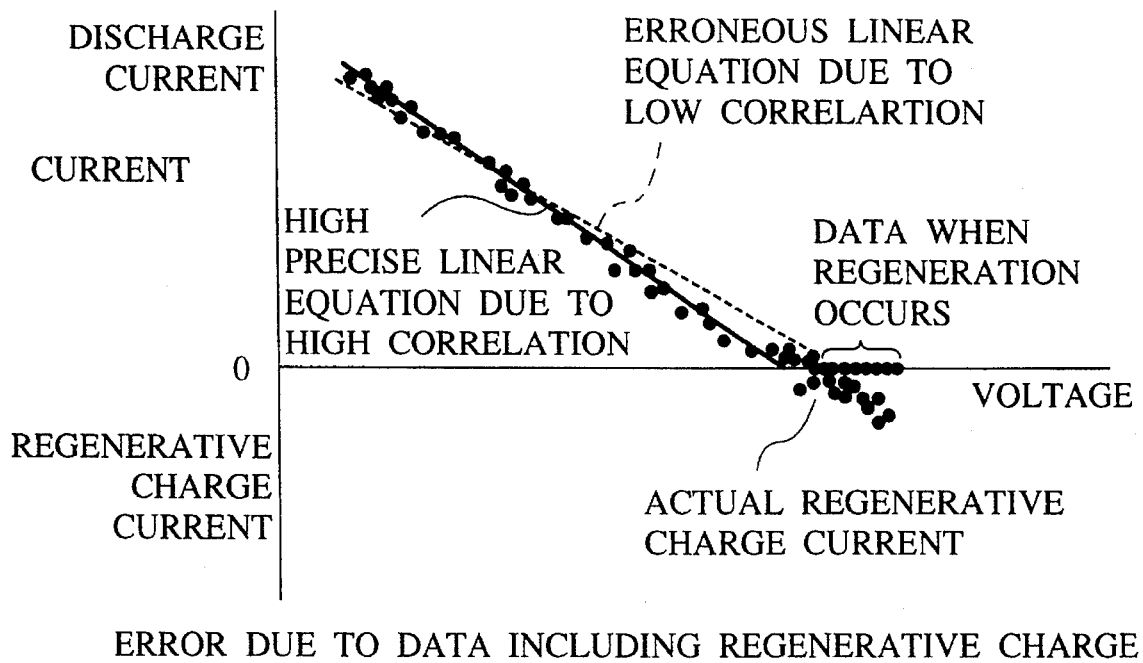
FIGS. 6A and 6B are graphical representations for assistance in explaining some erroneous correlation between the currents and voltages of the traction battery of an electric vehicle, respectively.
Figure 6B:
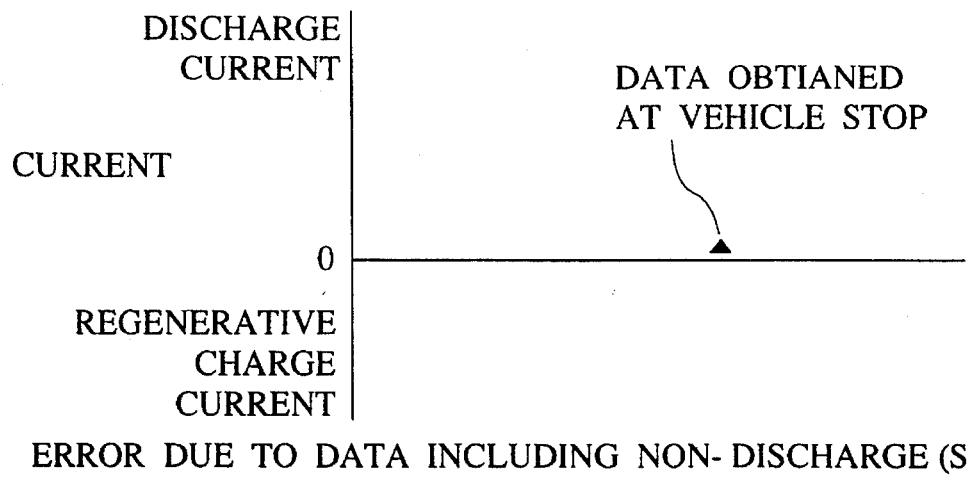

Therefore, the above-mentioned facts indicate the following two battery characteristics:

(1) There exists a negative correlation between the dispersive voltages and the dispersive currents of the battery as shown in FIG. 6A. Further, when the negative correlation coefficient is high (as when the battery is being discharged through a relatively high load), it is possible to calculate a precise approximate linear function indicative of a trend of the dispersive voltage and current data, also as shown in FIG. 6A. However, when the battery is charged by a regenerative current or when the battery is not discharged, it is impossible to calculate a precise approximate linear function indicative of a trend of the same data, also as shown in FIGS. 6A and 6B. This is because the negative correlation between the battery voltage and current data can be obtained only when the battery is being discharged.

Therefore, in the present invention, the erroneous linear function due to the regenerative charge or non-discharge is omitted to prevent the battery capacity from being updated erroneously on the basis of the erroneously obtained approximate linear function.

(2) Further, as already explained, since the above-mentioned approximate linear function changes with increasing consumption of the battery, once a precise approximate linear function indicative of a trend of the dispersive battery voltages and currents can be obtained, a remaining battery capacity can be obtained and therefore updated on the basis of the detected voltage corresponding to a reference current along the obtained approximate linear function.

An embodiment of the remaining battery capacity measuring apparatus according to the present invention will be described hereinbelow with reference to the attached drawings, by taking the case where applied to measure the remaining capacity of a traction battery mounted on an electric vehicle.

Figure 1:
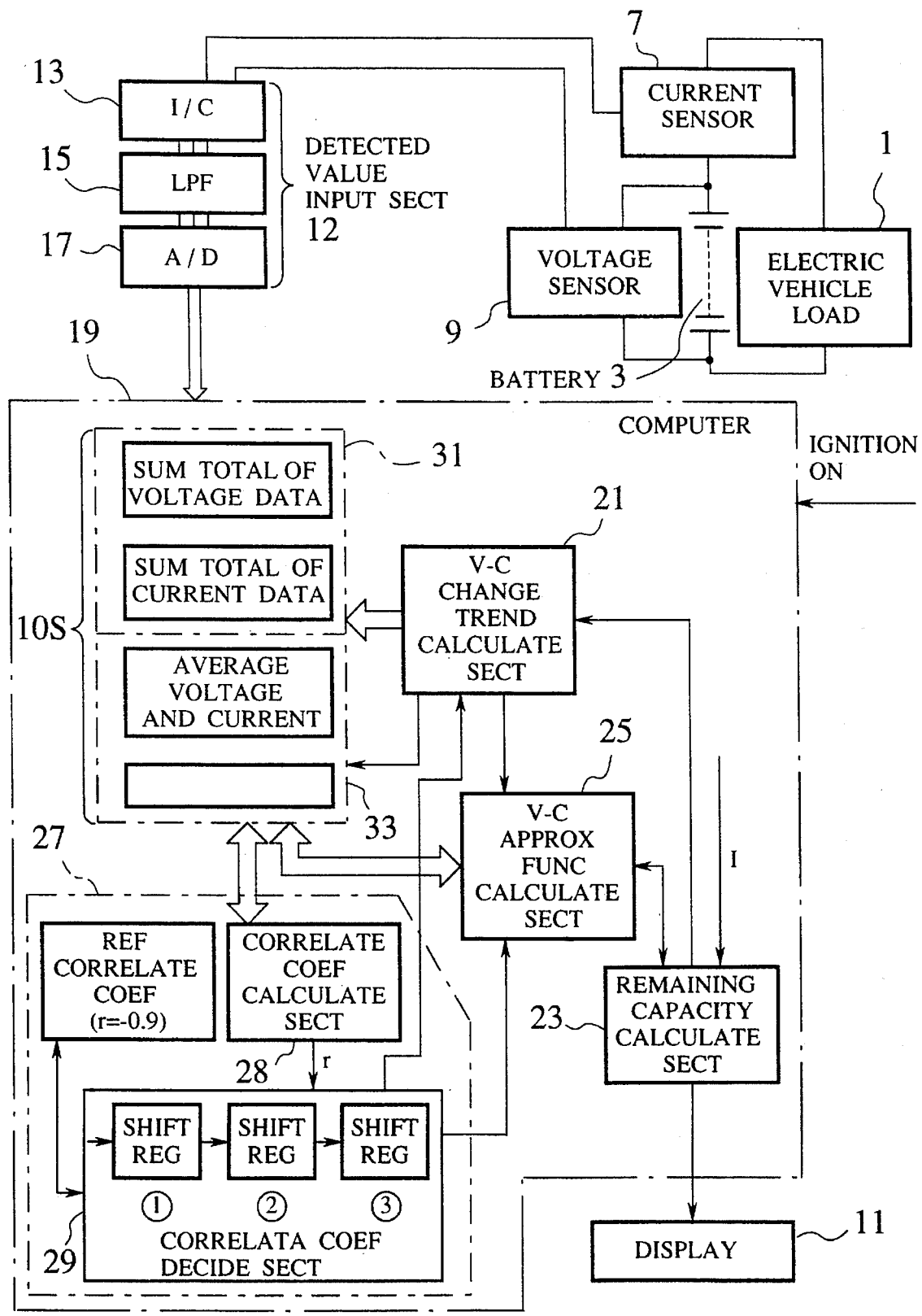
FIG. 1 is a block diagram showing an embodiment of the remaining battery capacity measuring apparatus according to the present invention.

In FIG. 1, the measuring apparatus is roughly composed of a traction battery 1, a battery current sensor 7, a voltage sensor 9, a detected value inputting section 12, a computer 19, and a display unit 11.

In more detail, the traction battery 3 is connected to a load (e.g., motor) 1 of an electric vehicle. Further, the current sensor 7 is connected in series to the battery 3 to detect dispersive currents flowing through the battery 3, and the voltage sensor 9 is connected in parallel to the battery 3 to detect dispersive terminal voltages of the battery 3.

The detected value inputting section 12 comprises an input/output interface 13, a low-pass filter (LPF) 15, and an analog-digital converter (A/D) 17. Detected dispersive battery terminal voltages and discharge currents are inputted to the detected value inputting section 12 from the current sensor 7 and the voltage sensor 9, to remove noise from the dispersive voltages and dispersive currents and to convert the inputted analog signals to digital signals corresponding thereto, respectively.

The computer 19 is provided with such software functions which correspond to such hardware functions as a voltage-current change trend calculating section 21, a remaining battery capacity calculating section 23, a voltage-current approximate linear function calculating section 25, a decision section 27, etc. The computer 19 is activated by a power supplied from a subsidiary battery, whenever an ignition key is turned on.

When the computer is activated, a CPU of the computer samples the detected digital dispersed voltage and current data from the voltage-current change trend calculating section 21, and stores the sampled data in a data memory 31 for each first predetermined time interval (e.g., 1 ms). Further, the CPU calculates an average value of a predetermined number (e.g., 100 units) of the sampled dispersive voltage data and an average value of a predetermined number (e.g., 100 units) of the sampled dispersive current data for each second predetermined time interval (e.g., 100 ms). The calculated average voltage and current data are stored in an average memory 33. Further, the CPU reads a predetermined number (e.g., 100 units) of the calculated average voltage data and a predetermined number (e.g., 100 units) of the calculated average current data, and clears both the memories 31 and 33 for each third predetermined time interval (e.g., 10 sec). In summary, the CPU obtains a plurality (100 units) of the average voltage data and a plurality (100 units) of the average current data for each 10 sec. On the basis of the obtained average voltage data (AVE V) and the average current data (AVE C) obtained both for each 10 sec, the CPU calculates a sum total (SUM AVE V) of the average voltage data, a sum total (SUM AVE C) of the average current data, and a sum total of the average voltage and current products (SUM AVE VC). These calculated data are used to calculate an approximate linear function and a correlation coefficient related to the dispersive voltages and currents (described in detail later).

That is, the voltage-current approximate linear function calculating section 25 reads a plurality of the average voltage data and a plurality of the average current data from the memory 33 for each 10 sec, to calculate a voltage-current approximate linear equation (Y=aX+b) for each 10 sec in accordance with the least square method, by which a sum total of squares of the errors between the calculated values and the actually measured values is minimized (described in detail later).

Whenever the voltage-current approximate linear function calculating section 25 obtains the voltage-current approximate linear equation (Y=aX+b), the remaining battery capacity calculating section 23 specifies a voltage value X on the voltage-current coordinates on the basis of a previously determined discharge current value Y and in accordance with the approximate linear equation (Y=aX+b); and displays the specified voltage value on the display unit 11 as a remaining battery capacity.

Further, the deciding section 27 is composed of at least a correlation coefficient calculating section 28 and a correlation coefficient deciding section 29. Whenever 100-units of the average voltage data and 100-units of the average current data are obtained, the correlation coefficient calculating section 28 calculates a correlation coefficient r between these average voltage and current data (described in detail, later).

The correlation coefficient deciding section 29 includes three shift registers. Until three different correlation coefficients r are stored in sequence in these three shift registers respectively, this correlation coefficient deciding section 29 activates the voltage-current change trend calculating section 21 so as to sample dispersive voltage and current data in sequence. However, when three different correlation coefficients r have been stored in the shift registers after a predetermined time (e.g., 30 sec), the coefficient deciding section 29 decides whether the correlation coefficients r are equal to or less than a reference correlation coefficient ($r=-0.9$). When the three correlation coefficients 4 are all equal to or less than the reference value continuously, the correlation coefficient deciding section 29 activates the voltage-current approximate linear function calculating section 25 to read data stored in the memory 33 which corresponds to the correlation coefficient stored in the middle shift register. The read voltage and current data are supplied to the remaining capacity calculating section 23 to display the remaining battery capacity on the display 11, as already explained.

Figure 2:
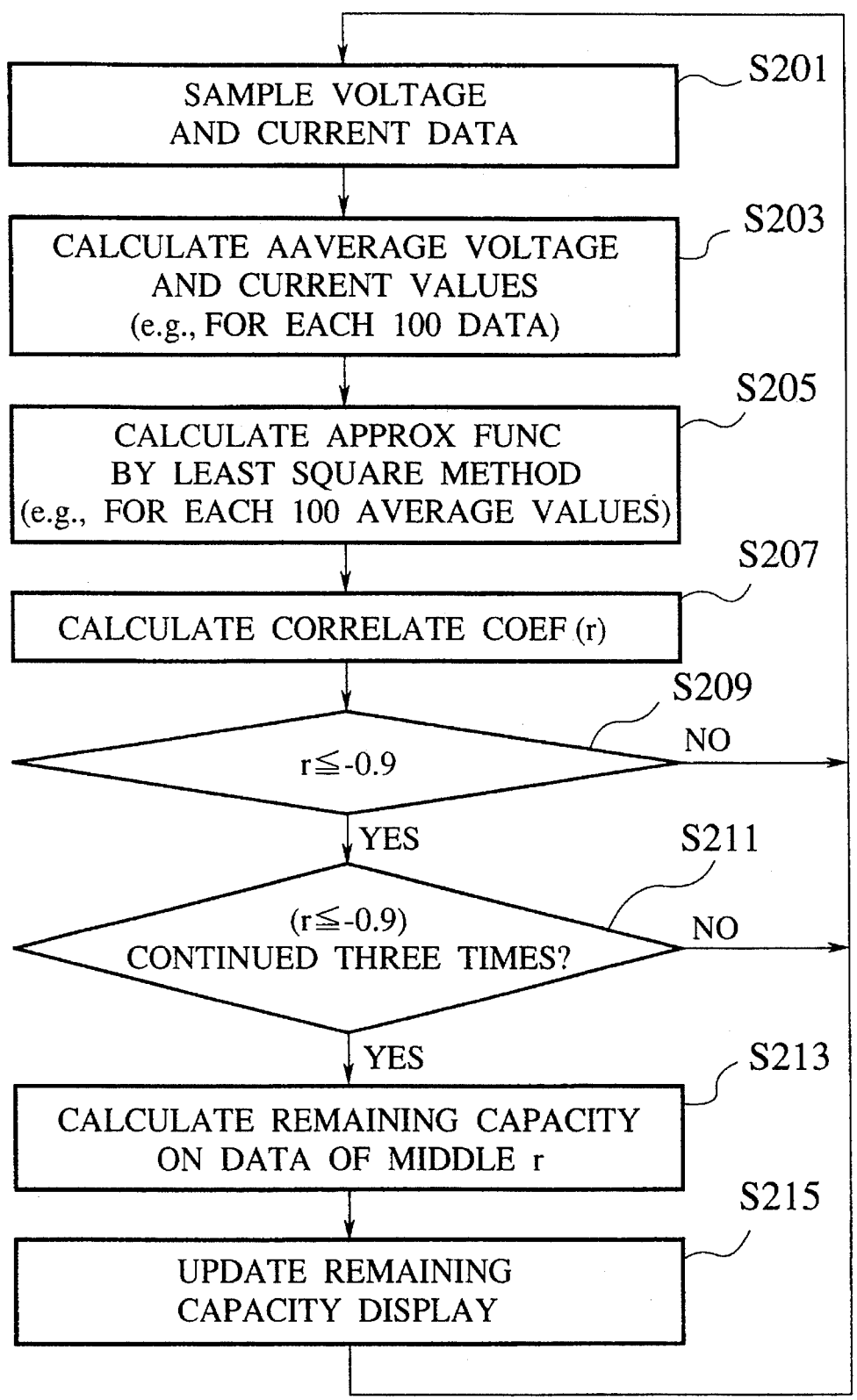
FIG. 2 is a flowchart for assistance in explaining the operation of the remaining battery capacity measuring apparatus shown in FIG. 1.

The operation of the above-mentioned remaining battery capacity measuring apparatus will be described in further detail hereinbelow with reference to a flowchart shown in FIG. 2.

When the battery terminal voltages detected by the voltage sensor 9 and the battery discharge currents flowing through the load 1 and detected by the current sensor 7 are both applied from the detected value inputting circuit 12 to the computer 19, the CPU of the computer 19 samples these terminal voltage data and the discharge current data for each 1 ms (in step S201).

Further, the CPU calculates an average value of a predetermined number (e.g., 100 units) of these voltage data and an average value of a predetermined number (e.g., 100 units) of these current data; and stores these calculated average data for each 100 ms (in step S203).

Further, the CPU calculates an approximate linear function on the basis of the 100-units of the average voltage and current data and in accordance with the least square method for each 10 sec (in step S205).

Further, the CPU calculates a correlation coefficient r between the 100-units of the average voltage and current data (in step S207).

Further, the CPU discriminates whether the calculated correlation coefficient r is equal to or less than $-0.9$ (in step S209). If yes; that is, if r is more than $-0.9$ (e.g., $-0.5$) in step S209 (this indicates a low correlation), the CPU returns to step S201 to sample the voltage and current data again to obtain another correlation coefficient, without processing the succeeding steps. However, if r is equal to or less than $-0.9$ (e.g., $-0.98$) in step S209 (this indicates a high correlation), the CPU discriminates whether the correlation coefficient r equal to or less than $-0.9$ continues three times (in step S211). If no; that is, if does not continue, the CPU returns to step S201 to sample the voltage and current dispersion data again to obtain another correlation coefficient, without processing the succeeding steps. Here, however, if the correlation coefficient r equal to or less than $-0.9$ continues three times (in step S211), the CPU reads the average voltage and current data corresponding to the correlation coefficient and stored in the middle shift register from the memory 33, and obtains a remaining battery capacity on the basis of the read average voltage and current data and in accordance with the already calculated approximate linear function (in step S215).

Further, the CPU updates the remaining battery capacity display (in step S215).

Here, the reason why the remaining battery capacity is updated only when the correlation coefficient r equal to or less than $-0.9$ continues three times will be explained.

First, if there exists a perfect correlation between the voltages and the currents of the battery, the correlation coefficient r is $-1$. Therefore, if the correlation coefficient r is equal to or less than $-0.9$ (e.g., $r=-0.98$) this implies a high correlation. On the other hand, if the correlation coefficient is more than $-0.9$ (e.g., $r=-0.5$), this implies a low correlation.

Therefore, in the present invention, only when there exists a high correlation coefficient ($r \leq 0.9$) between the battery voltages and currents and further only when this high correlation coefficient is obtained three times in sequence, the remaining battery capacity is updated, without updating the remaining battery capacity when the correlation coefficient is low ($r > -0.9$).

Here, the low correlation (e.g., $r=-0.5$) occurs due to the following cases:

(1) When the electric vehicle is running on a descending road, a regenerative brake is applied to the electric vehicle and therefore a regenerative current flows from the motor to the traction battery, so that the traction battery is charged, without consuming battery power.

(2) When the electric vehicle is kept stopped, the discharge current is zero and thereby the traction battery power consumption is almost zero.

Figure 4:
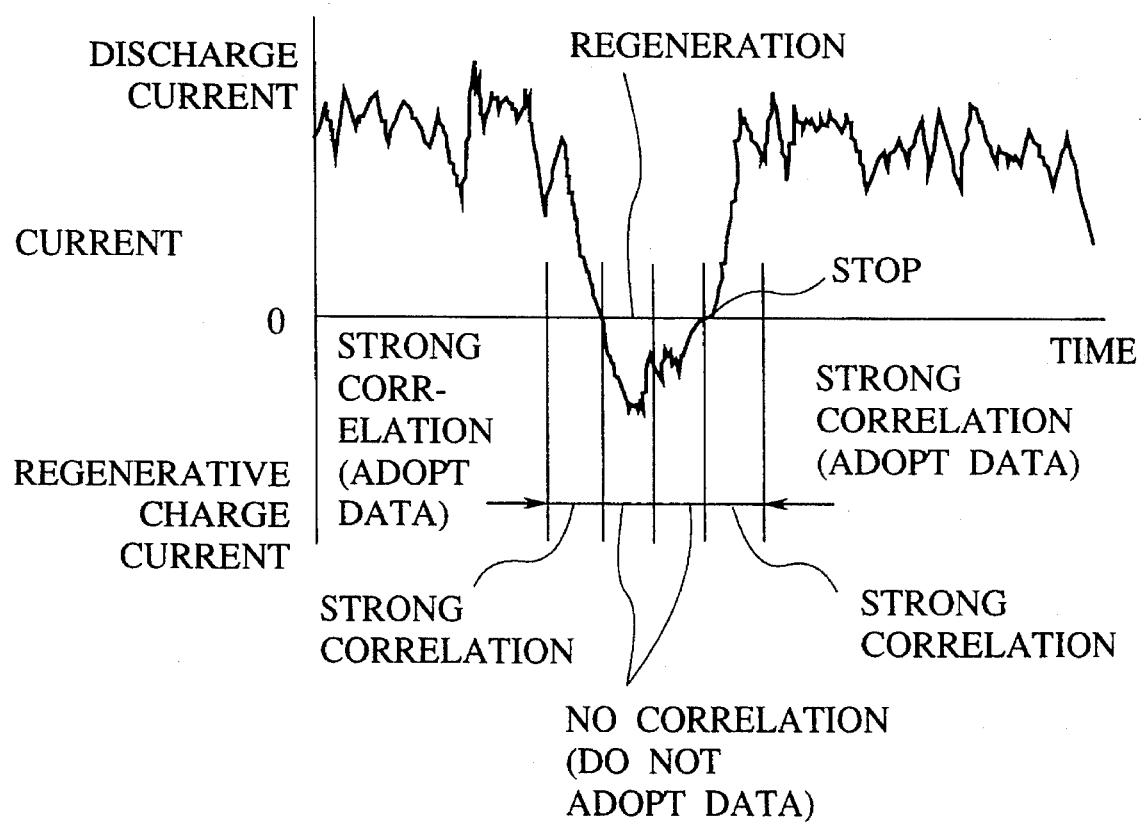
FIG. 4 is a graphical representation showing an example of variation of battery current with the lapse of time, for assistance in explaining the case where the regenerative current is being generated or the vehicle is left stopped, so that the dispersive voltage and current data are not adopted.

FIG. 4 shows that the traction battery is charged by the regenerative current during the regenerative operation and further the battery discharge is zero at a vehicle stop. In these conditions, there exists no correlation between the currents and voltages, so that voltage and current data are not adopted under these conditions. Further, with respect to the voltage and current data other than the above, since there exists a correlation between the battery voltages and currents, the data are adopted to update the remaining battery capacity.

Further, the reason why the voltage and current data corresponding to the middle coefficient of the three continuous correlation coefficients are adopted is as follows: when a regenerative current is generated, since the correlation between the voltages and the currents is calculated on the basis of indefinite or non-precise discharge currents, there exists such a possibility that a high correlation coefficient is discriminated erroneously in spite of a low correlation coefficient. However, this erroneous decision of the correlation coefficient will not occur three times continuously. In other words, although there exists a possibility that a low correlation coefficient is erroneously calculated as being a high correlation on the basis of the data stored in the shift registers arranged on both sides of the middle shift register, as far as the electric vehicle is running under the ordinary travelling conditions, since a high correlation can be obtained between the battery voltages and currents, it is possible to update the remaining battery capacity correctly and reliably by use of the data stored in the middle shift register.

Figure 3:
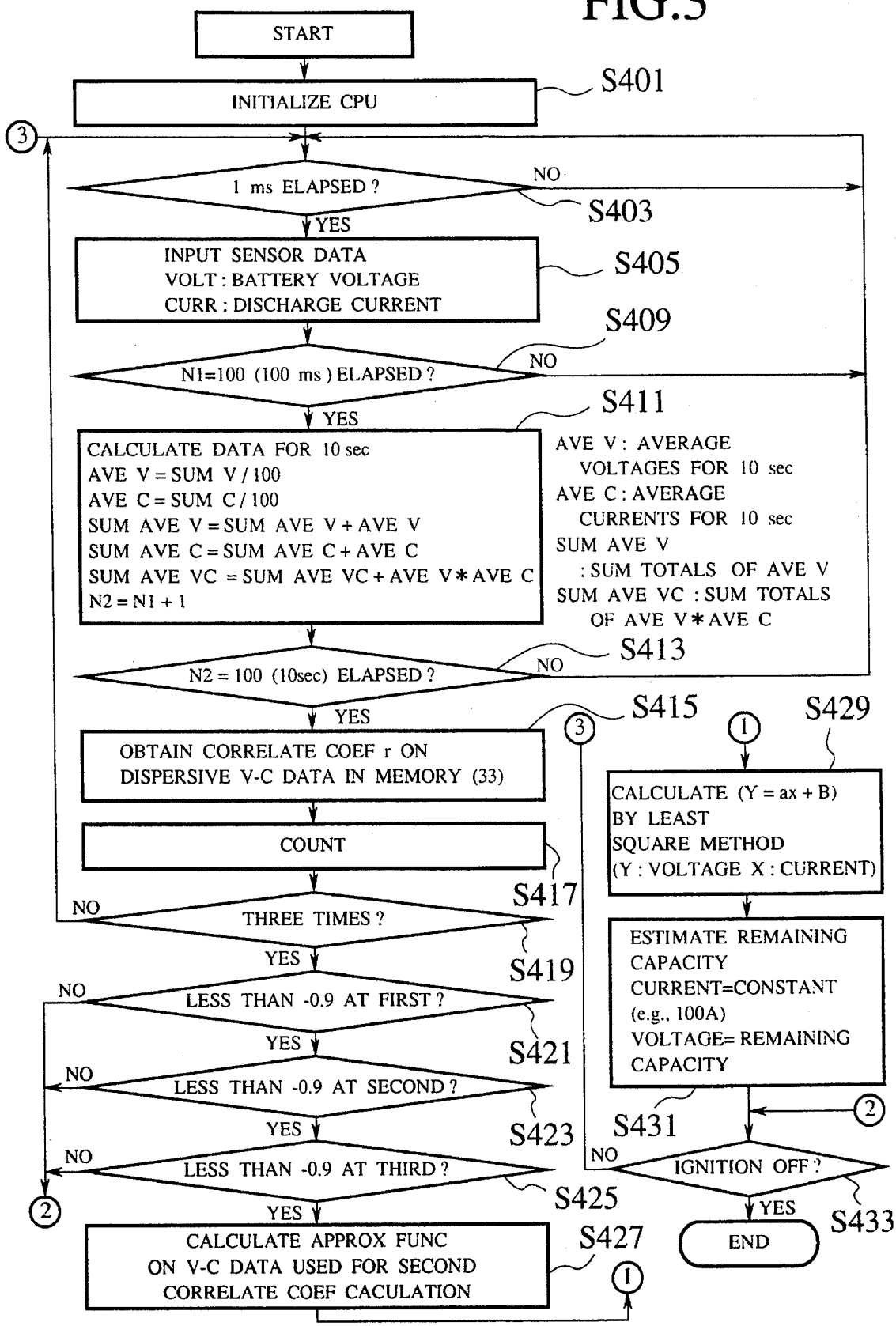
FIG. 3 is a more detailed flowchart for assistance in explaining the operation of the remaining battery capacity measuring apparatus shown in FIG. 1.

The operation of the remaining battery measuring apparatus according to the present invention will be described in further detail with reference to FIG. 3, in which the approximate function is calculated only when the obtained correlation coefficient is less than $-0.9$, being different from the case shown in FIG. 2 in which the approximate linear function is obtained before deciding the correlation coefficient r.

When the ignition key is turned on, the computer is activated by a supply voltage of a subsidiary battery to check the respective sections and to initialize the CPU (e.g., transfer a program stored in a ROM to a RAM) (in step S401).

Then, the CPU (the voltage-current change trend calculating section 21) discriminates whether 1 ms has elapsed (in step S403).

If 1 ms has elapsed, the CPU (the voltage-current change trend calculating section 21) reads the sensor data such as battery voltages (VOLT) and discharge currents (CURR) from the detected value inputting circuit section 12 and stores the read data in the memory 31 (in step S405).

Further, the CPU counts the number of the reading and storing operations, and discriminates whether the count value N1 reaches 100, that is, 100 ms has elapsed (in step 409). If not yet elapsed, the CPU returns to step S403 to read the terminal voltages and the discharge currents again and to store the read data in the memory 31 for each 1 ms, repeatedly, while counting the number of the reading and storing operations.

If 100 ms has elapsed; that is, when N1(100)-units of voltages and currents have been obtained for 100 ms, the CPU (the voltage-current change trend calculating section 21) calculates a sum total (SUM V) of the detected voltage data and a sum total (SUM C) of the detected current data of 100 units, an average voltage value (AVE V=SUM V/100) and an average current value (AVE C=SUM C/100), a sum total (SUM AVE V) of the average voltage values (AVE V) as (SUM AVE V=SUM AVE V+AVE V) and a sum total (SUM AVE C) of the average current values (AVE C) as (SUM AVE C=SUM AVE C+AVE C), and a sum total (SUM AVE VC) of the average voltage and current products as (SUM AVE VC=SUM AVE VC AVE V*AVE C). The above-mentioned calculations are repeated for 10 sec. The obtained average values are both stored in the memory 33 (in step S411). Further, the CPU discriminates whether the number N2 of the respective calculated values reaches 100-units; that is, 10 sec has elapsed (in step 413). If not yet elapsed, the CPU returns to step S403 to repeat the above operation, until the 100 units of the average voltage and current data can be obtained for 10 sec, on the basis of the 100-units of detected average voltages and currents obtained for 100 ms calculated on the basis of data sampled for each 1 ms. As described above, a plurality (100 units) of average voltage data (AVE V) and average current data (AVE C) can be obtained for each 10 sec on the voltage and current axes, as shown in FIG. 6A, respectively. The average data and the other sum total data are stored in the memory 33.

Further, the CPU (the correlation coefficient calculating section 28) calculates a correlation coefficient r on the basis of the calculated and stored voltage and current data (in step S415).

Further, the CPU (the correlation coefficient deciding section 29) counts the number of calculated correlation coefficients (in step S417). When the count value does not reach three (in step S419), the CPU returns to step S403 to collect other data.

Further, when the CPU (the correlation coefficient deciding section 29) discriminates that the count value reaches three, the CPU discriminate whether the first correlation coefficient is less than −0.9 (in step S421). If the first correlation coefficient is less than −0.9, the CPU discriminates whether the second correlation coefficient is less than −0.9 (in step S423). Further, if the second correlation coefficient (the middle value) is less than −0.9, the CPU discriminates whether the third correlation coefficient is less than −0.9 (in step S425). When the three correlation coefficients are all less than −0.9 continuously, the CPU transfers the voltage and current data used to calculate the second (middle) correlation coefficient tothe voltage-current approximate linear function calculating section 25 (in step S427).

Further, the CPU (the voltage-current approximate linear function calculating section 25) calculates an approximate 11near function indicative a trend of the average voltage and current data in accordance with the least square method (in step S429).

Further, the CPU (the remaining capacity calculating section 23) calculates a remaining battery capacity on the basis of the average voltage value corresponding to a reference current (e.g., 100A) along the calculated voltage-current linear equation Y=aX+b (in step S431).

Further, the CPU discriminates whether the ignition key is turned off (in step S433). If not turned off, the CPU returns to step S403 to repeat the above-mentioned process. If turned off, the CPU ends the control operation. When the obtained correlation coefficient r is more than −0.9 in steps S241, S243 and S245, the CPU ends without calculating the remaining battery capacity.

Here, the correlation coefficient r can be obtained on the basis of the 100-units of average voltage and current data stored in the memory 33 and in accordance with the following formula:
where S (XX) denotes a sum of squares of voltage data; S (YY) denotes a sum of squares of current data; and S (XY) denotes $$r = \frac{S(XY)}{S(XX)\,S(XY)}$$

a sum of products of voltage and current data.
Further, $$S(XX) = \Sigma(Xi-X)^2 = \Sigma Xi^2 - (\Sigma Xi)^2/n$$

$$S(YY) = \Sigma(Yi-Y)^2 = \Sigma Yi^2 - (\Sigma Yi)^2/n$$

$$S(XY) = \Sigma(Xi-X)(Yi-Y) = \Sigma Xi\,Yi - (\Sigma Xi)(\Sigma Yi)/n$$

where Xi denotes voltage data; Yi denotes current data; X denotes an average value of the voltage data; and Y denotes an average value of the current data.

Further, the voltage-current approximate linear function can be obtained by the least square method. In other words, the coefficients a and b of a linear equation of (Y=aX+b) can be obtained by the least square method as follows:

Here, if a sum total of squares of the error between the calculated values and the actually measured values is denoted by S $$S = \Sigma(Yi - (\alpha Xi + b))^2$$

On the basis of the above equation, a solution of when the values obtained by differentiating S with respect to a and b become zeros, respectively are obtained as follows:

$$\theta S/\theta b = 2\sum_{i=1}^{n} b + 2\sum_{i=1}^{n} Xia - 2\sum_{i=1}^{n} Yi = 0$$

$$\theta S/\theta a = 2\sum_{i=1}^{n} Xib + 2\sum_{i=1}^{n} Xi^2 a - 2\sum_{i=1}^{n} Xi\,Yi = 0$$

By establishing the above two simultaneous equations, the following formulae can be obtained as $$a = \frac{\sum_{i=1}^{n} Xi\,Yi - \left(\sum_{i=1}^{n} Xi \sum_{i=1}^{n} Yi\right)/n}{\sum_{i=1}^{n} Xj^2 - \left(\sum_{i=1}^{n} Xi\right)^2/n}$$

$$b = \sum_{i=1}^{n} Yi/n - 2\sum_{i=1}^{n} Xi(a/n)$$

As a result, it is possible to obtain X (voltage) value on the basis Y (current) at any time in accordance with the linear equation as $$X = (Y-b)/a$$

Further, in the above-mentioned embodiment, although the remaining battery capacity measuring apparatus has been described by taking the case when applied to the apparatus for measuring a traction battery mounted on an electric vehicle, it is possible to apply the apparatus and the method according to the present invention to various apparatus provided with a battery whose discharge current varies violently or stably without fluctuations.

Further, in the above-mentioned embodiment, the data collecting time is determined as 10 sec, the data collection time can be determined freely according to the apparatus.

In the remaining battery capacity measuring method and apparatus according to the present invention, the dispersive terminal voltages and dispersive discharge currents of a battery connected to a fluctuating load are sampled. Further, an approximate linear function indicative of a trend of the sampled terminal voltages and the sampled discharge currents is calculated, and a plurality (three) of the correlation coefficients between these sampled terminal voltages and the sampled discharge currents are calculated. Further, a remaining battery capacity is calculated on the basis of a sampled terminal voltage corresponding to a reference discharge current and in accordance with the calculated approximate linear function. In this case, when a strong correlation coefficient is not obtained three times continuously, since the remaining battery capacity is not calculated in accordance with the approximate linear function indicative of a trend of the voltages and currents of the battery, it is possible to prevent the remaining battery capacity from being updated erroneously, as when the battery is charged by a regenerative current of a motor (e.g., when an electric vehicle is running on a descending load) or when the battery is not discharged (e.g., when the electric vehicle is left stopped).

What is claimed is:

1. A remaining battery capacity measuring method, comprising the steps of:

sampling dispersive terminal voltages and dispersive discharge currents of a battery connected to a fluctuating load;

calculating an approximate linear function indicative of a trend of the sampled dispersive terminal voltages and the sampled dispersive discharge currents;

calculating a correlation coefficient between the sampled dispersive terminal voltages and the sampled dispersive discharge currents;

comparing the calculated correlation coefficient with a negative reference value, to discriminate whether the calculated correlation coefficient indicates a strong correlation or not;

discriminating whether the strong correlation is calculated repeatedly by a predetermine number of times or not;

calculating a remaining battery capacity on the basis of a sampled terminal voltage corresponding to a reference discharge current and in accordance with the calculated approximate linear function, only when the strong correlation is calculated repeatedly by the predetermined number of times; and repeating the above-mentioned steps to update the calculated remaining battery capacity for each predetermined time interval.

2. A remaining battery capacity measuring method, comprising the steps of:

sampling dispersive terminal voltages and dispersive discharge currents of a battery connected to a fluctuating load;

calculating a correlation coefficient between the sampled dispersive terminal voltages and the sampled dispersive discharge currents;

comparing the calculated correlation coefficient with a negative reference value, to discriminate whether the calculated correlation coefficient indicates a strong correlation or not;

discriminating whether the strong correlation is calculated repeatedly by a predetermine number of times or not;

calculating an approximate linear function indicative of a trend of the sampled dispersive terminal voltages and the sampled dispersive discharge currents, only when the strong correlation is calculated repeatedly by the predetermined number of times;

calculating a remaining battery capacity on the basis of a sampled terminal voltage corresponding to a reference discharge current and in accordance with the calculated approximate linear function; and repeating the above-mentioned steps to update the calculated remaining battery capacity for each predetermined time interval.

3. The remaining battery capacity measuring method of claim 1, wherein step of sampling dispersive terminal voltages and dispersive discharge currents comprises the steps of:

detecting the dispersive terminal voltages and discharge currents for each first predetermined time interval;

calculating an average terminal voltage and an average discharge current on the basis of the detected dispersive terminal voltages and the detected dispersive discharge currents, respectively for each second predetermined time interval longer than the first predetermined time interval;

counting the number of the calculated average terminal voltages or the calculated average discharge currents;

comparing the counted number with a predetermined value;

when the counted number reaches the predetermined number, calculating the approximate linear function and the correlation coefficient, respectively on the basis of the average terminal voltages and the average discharge currents, for each third predetermined time interval longer than the second predetermined time interval.

4. The remaining battery capacity measuring method of claim 1, wherein in step of calculating a remaining battery capacity on the basis of a sampled voltage corresponding to a reference discharge current and in accordance with the calculated approximate linear function, the remaining battery capacity is calculated in accordance with the approximate linear function calculated by the sampled voltages and currents used to calculate the middle correlation coefficient of a plurality of the repeatedly calculated correlation coefficients.

5. A remaining battery capacity measuring apparatus, which comprises:

voltage-current change trend calculating means for detecting dispersive terminal voltages and dispersive discharge currents of a battery connected to a fluctuating load;

voltage-current approximate linear function calculating means for calculating an approximate linear function indicative of a trend of the detected dispersive terminal voltages and the detected dispersive discharge currents;

correlation coefficient calculating means for calculating a correlation coefficient between the detected dispersive terminal voltages and the detected dispersive discharge currents;

correlation coefficient deciding means for deciding whether the calculated correlation coefficient equal to or less than a negative reference value can be calculated by a predetermined number of times continuously or not, and for enabling said voltage-current approximate linear function calculating means to output the calculated approximate linear function, only when the correlation coefficient equal to or less than the negative reference value can be calculated by the predetermined number of times continuously; and remaining battery capacity calculating means for calculating a remaining battery capacity on the basis of a terminal voltage corresponding to a reference discharge current in accordance with the approximate linear function outputted by said voltage-current approximate linear function calculating means.

6. The remaining battery capacity measuring apparatus of claim 5, wherein when the calculated correlation coefficient equal to or less than the negative reference value cannot be calculated by the predetermined number of times continuously, said correlation coefficient deciding means disables said voltage-current approximate linear function calculating means to output the calculated approximate linear function.

7. The remaining battery capacity measuring apparatus of claim 5, wherein when a calculated correlation coefficient equal to or less than the negative reference value can be calculated by the predetermined number of times continuously, said correlation coefficient deciding means enables said voltage-current approximate linear function calculating means to output a middle approximate linear function calculated by the detected terminal voltages and the detected discharge currents used to calculate a middle correlation coefficient of a plurality of the repeatedly calculated correlation coefficients.

\* \* \* \* \*